US012665009B2

(12) United States Patent
Ha

(10) Patent No.: US 12,665,009 B2
(45) Date of Patent: Jun. 23, 2026

(54) MEMORY DEVICE AND OPERATING METHOD THEREOF

(71) Applicant: SK hynix Inc., Icheon-si (KR)

(72) Inventor: Tae Jung Ha, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 161 days.

(21) Appl. No.: 18/399,456

(22) Filed: Dec. 28, 2023

(65) Prior Publication Data

US 2025/0054530 A1    Feb. 13, 2025

(30) Foreign Application Priority Data

Aug. 10, 2023    (KR) ........................ 10-2023-0104691

(51) Int. Cl.
    *G11C 13/00*        (2006.01)
    *G11C 11/16*        (2006.01)
(52) U.S. Cl.
    CPC ...... *G11C 11/1673* (2013.01); *G11C 11/1659* (2013.01); *G11C 11/1693* (2013.01)
(58) Field of Classification Search
    CPC ............ G11C 11/1673; G11C 11/1659; G11C 11/1693
    See application file for complete search history.

(56) References Cited

U.S. PATENT DOCUMENTS

| | | |
|---|---|---|
| 11,081,155 B2 | 8/2021 | Lee et al. |
| 11,139,027 B1 * | 10/2021 | Islam .................... G11C 13/004 |
| 11,170,852 B1 | 11/2021 | Kinney et al. |
| 2020/0273520 A1 * | 8/2020 | Kang ................. G11C 13/0028 |
| 2023/0054577 A1 * | 2/2023 | Chang ................. G11C 11/1657 |
| 2024/0341206 A1 * | 10/2024 | Ha .......................... H10B 63/24 |

FOREIGN PATENT DOCUMENTS

KR        20190142754 A    12/2019

* cited by examiner

*Primary Examiner* — Min Huang
(74) *Attorney, Agent, or Firm* — Perkins Coie LLP

(57)        ABSTRACT

Memory devices and operating methods are disclosed. In an embodiment, a memory device may include a memory cell array including a plurality of memory cells, each of the plurality of memory cells configured to store a data value corresponding to read data to be read out through a plurality of conductive lines, and a read circuit connected to the plurality of conductive to generate the read data corresponding to the data value stored in a selected memory cell among the plurality of memory cells based on or according to whether there is a change in a cell current flowing through the selected memory cell during a single read period.

18 Claims, 5 Drawing Sheets

<u>100</u>

XADD → WORD LINE SELECTION CIRCUIT — 120

WLs

MEMORY CELL ARRAY — 110

BLs

YADD → BIT LINE SELECTION CIRCUIT — 130

IC

RD → READ CIRCUIT — 140 → DT

Figure 6:
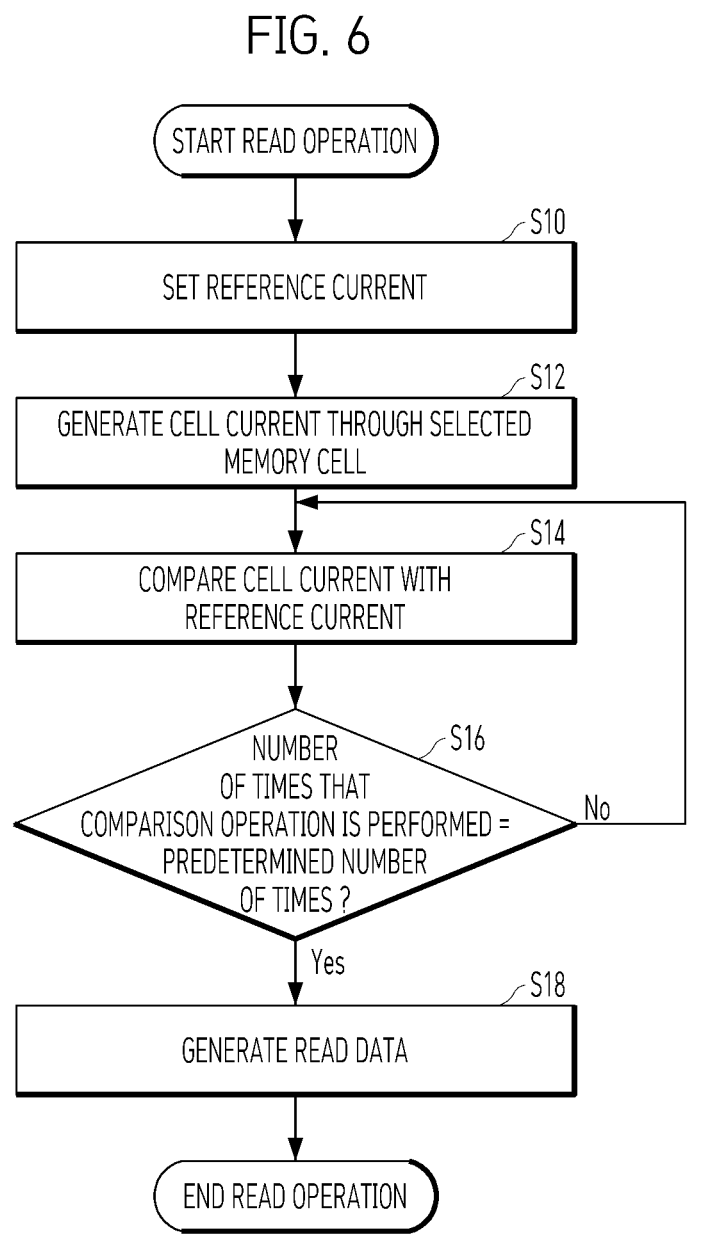

START READ OPERATION

S10

SET REFERENCE CURRENT

S12

GENERATE CELL CURRENT THROUGH SELECTED
MEMORY CELL

S14

COMPARE CELL CURRENT WITH
REFERENCE CURRENT

S16

NUMBER
OF TIMES THAT
COMPARISON OPERATION IS PERFORMED =
PREDETERMINED NUMBER
OF TIMES ?

No

Yes

S18

GENERATE READ DATA

END READ OPERATION

MEMORY DEVICE AND OPERATING METHOD THEREOF

CROSS-REFERENCE TO RELATED APPLICATION(S)

This application claims the priority and benefits of Korean Patent Application No. 10-2023-0104691, filed on Aug. 10, 2023, the disclosure of which is incorporated herein by reference in its entirety.

TECHNICAL FIELD

The technology disclosed in this patent relates to a semiconductor design, and more particularly, to a memory device for storing data by using variable resistance characteristics and an operating method of the memory device.

BACKGROUND

With the increasing demands for high-capacity, low-power-consumption memory devices, a lot of research is being conducted on the next-generation memory devices such as non-volatile memory devices that do not require refresh operations. Such next-generation memory devices are required to have the high density of dynamic random access memory (DRAM) devices, the non-volatility of flash memory devices, and the high speed of static random access memory (SRAM) devices. Examples of the next-generation memory devices may include phase change random access memory (PRAM), nano floating gate memory (NFGM), polymer random access memory (PoRAM), magnetic random access memory (MRAM), ferroelectric random access memory (FeRAM), and resistive random access memory (RRAM).

SUMMARY

Various embodiments of the disclosed technology relate to a memory device capable of preventing a read error when reading data from a selected memory cell, and an operating method of the memory device.

In an embodiment, a memory device may include: a memory cell array including a plurality of memory cells, each of the plurality of memory cells configured to store a data value corresponding to read data to be read out through a plurality of conductive lines; and a read circuit coupled to the plurality of conductive to generate the read data corresponding to the data value stored in a selected memory cell among the plurality of memory cells based on whether there is a change in a cell current flowing through the selected memory cell during a single read period. In some implementations, the plurality of conductive lines may include word lines and bit lines.

In an embodiment, a memory device may include: a memory cell array including a plurality of memory cells, each of the plurality of memory cells configured to store a data value corresponding to read data to be read out through a plurality of conductive lines; a sensing circuit coupled to the plurality of conductive lines compare a cell current flowing through a selected memory cell among the plurality of memory cells with a reference current during a single read period; and a determination circuit coupled to the sensing circuit to: generate the read data having a first data value responsive to a comparison result of the sensing circuit indicating that the cell current has a constant level during the single read period; or generate the read data having a second data value responsive to a comparison result of the sensing circuit indicating that the cell current has an oscillating level, during the single read period.

In an embodiment, an operating method of a memory device may include: setting a reference current to a lower level than a distribution of cell currents flowing through memory cells that are in a low resistance state; or a higher level than the distribution of the cell currents flowing through memory cells that are in a high resistance state higher than the low resistance state; performing M comparison operations to compare a cell current flowing through a selected memory cell among the memory cells with the reference current, wherein M is an integer larger than 1; and generating read data having a second data value responsive to a comparison result indicating that the cell current has an oscillating level.

BRIEF DESCRIPTION OF THE DRAWINGS

FIG. 6 is a flowchart illustrating an operation of the memory device illustrated in FIG. 1.

DETAILED DESCRIPTION

Some embodiments of the disclosed technology will be described below with reference to the accompanying drawings.

It will be understood that when an element is referred to as being "connected to" or "coupled to" another element, the element may be directly connected to or coupled to the other element, or electrically connected to or coupled to the other element with one or more elements interposed therebetween. In addition, it will also be understood that the terms "comprises," "comprising," "includes," and "including" when used in this specification do not preclude the presence of one or more other elements, but may further include or have the one or more other elements, unless otherwise mentioned. In the description throughout the specification, some components are described in singular forms, but the disclosed technology is not limited thereto, and it will be understood that the components may be formed in plural.

Magnetic random access memory (MRAM) has attracted much attention due to its fast read and write speed, high durability, non-volatility, and low power consumption during operation. The MRAM includes a plurality of memory cells, and each of the plurality of memory cells includes a variable resistance element. The variable resistance element may have characteristics of switching between different resistance states in response to changes in a magnetization direction of a magnetic layer. For example, the variable resistance element may be in a low resistance state when magnetization directions of two magnetic layers are parallel, and may be in a high resistance state when the magnetization directions of the two magnetic layers are antiparallel. When the variable resistance element is in the low resistance state, it is defined that "low (0)" data bit is stored in a corresponding memory cell. When the variable resistance element is in the high resistance state, it is defined that "high (1)" data bit is stored in a corresponding memory cell.

Figures 1, 2:
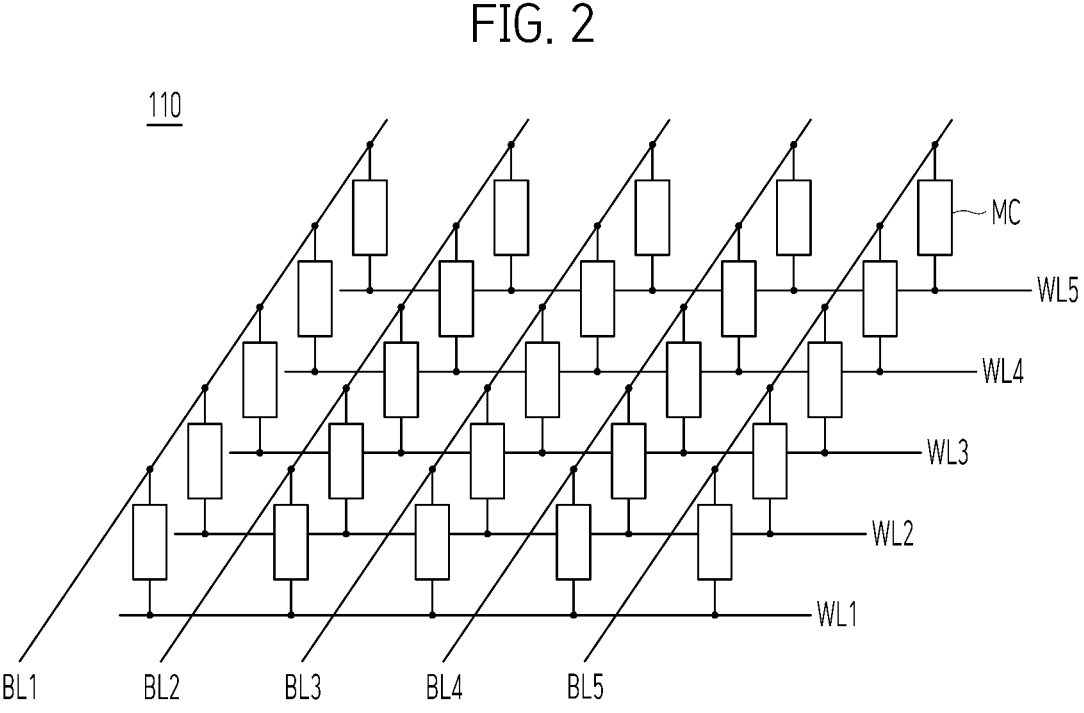
FIG. 1 is a block diagram illustrating a memory device based on an embodiment of the disclosed technology.
FIG. 2 is a block diagram illustrating an example of a memory cell array illustrated in FIG. 1.

FIG. 1 is a block diagram illustrating a memory device 100 based on an embodiment of the disclosed technology.

The memory device 100 may include a memory cell array 110, a word line selection circuit 120, a bit line selection circuit 130, and a read circuit 140.

The memory cell array 110 may include a plurality of memory cells arranged in a 2D or 3D structure. The plurality of memory cells may be connected to a plurality of word lines WLs extending in parallel in a row direction and a plurality of bit lines BLs extending in parallel in a column direction. The plurality of memory cells may be disposed at intersections between the plurality of word lines WLs and the plurality of bit lines BLs.

The word line selection circuit 120 may be connected to the memory cell array 110 through the plurality of word lines WLs. The word line selection circuit 120 may control respective voltages applied to the plurality of word lines WLs, on the basis of a row address XADD.

The bit line selection circuit 130 may be connected to the memory cell array 110 through the plurality of bit lines BLs. The bit line selection circuit 130 may control respective voltages applied to the plurality of bit lines BLs, on the basis of a column address YADD.

The read circuit 140 may be used to read out data (read data) DT from a selected memory cell among the plurality of memory cells included in the memory cell array 110. The selected memory cell may be a memory cell connected between a selected word line among the plurality of word lines WLs and a selected bit line among the plurality of bit lines BLs. The read circuit 140 may be connected to the plurality of bit lines BLs through the bit line selection circuit 130. The read circuit 140 may read a data value stored in the selected memory cell, through the selected bit line among the plurality of bit lines BLs.

The read circuit 140 may generate the read data DT corresponding to the data value stored in the selected memory cell, based on or according to whether or not there is a change in a cell current IC flowing through the selected memory cell during a single read period on the basis of a read enable signal RD. The single read period may be a predetermined unit read time when the read data DT is read from the selected memory cell. For example, during the single read period, the read circuit 140 may generate the read data DT having a first data value when the cell current IC has a constant level, and may generate the read data DT having a second data value when the cell current IC has an oscillating level. The read data DT may correspond to a resistance state of the selected memory cell. For example, the first data value may correspond to a high resistance state of the selected memory cell, and the second data value may correspond to a low resistance state of the selected memory cell.

FIG. 2 is a block diagram illustrating an example of the memory cell array 110 illustrated in FIG. 1. For example, FIG. 2 illustrates the memory cell array 110 connected to first to fifth word lines WL1 to WL5 and first to fifth bit lines BL1 to BL5.

Referring to FIG. 2, the memory cell array 110 may include first to $25^{th}$ memory cells MC. The first to $25^{th}$ memory cells MC may be disposed at intersections between the first to fifth word lines WL1 to WL5 and the first to fifth bit lines BL1 to BL5, and may be connected to respective word lines and respective bit lines. The first to fifth word lines WL1 to WL5 may extend in parallel in the row direction, and be spaced apart from one another by a predetermined interval in the column direction. The first to fifth bit lines BL1 to BL5 may extend in parallel in the column direction, and be spaced apart from one another by a predetermined interval in the row direction.

Although it is described as an example in the present embodiment that the memory cell array 110 has the 2D structure as illustrated in FIG. 2, the disclosed technology is not necessarily limited thereto, and the memory cell array 110 may have the 3D structure. For example, the 3D structure may include a plurality of layers stacked in a vertical direction. Each of the layers may include the 2D structure illustrated in FIG. 2.

Figure 3:
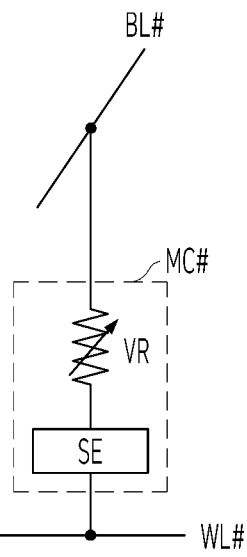
FIG. 3 is a block diagram illustrating a memory cell, a word line, and a bit line illustrated in FIG. 2.

FIG. 3 is a block diagram illustrating a memory cell MC # among the memory cells MC, a word line WL # among the word lines WL1 to WL5, and a bit line BL # among the bit lines BL1 to BL5 illustrated in FIG. 2.

Referring to FIG. 3, the memory cell MC # may be disposed and connected between the corresponding word line WL # and the corresponding bit line BL #. The memory cell MC # may include a selection element SE and a variable resistance element VR connected in series between the word line WL # and the bit line BL #.

The selection element SE may be electrically connected between the word line WL # and the variable resistance element VR. The selection element SE may control a flow of a current, e.g., a direction of a current according to a voltage difference between its ends or the size of the current flowing through it. Examples of the selection element SE may include an MOS transistor, a PN diode, and an ovonic threshold switching (OTS) element.

The variable resistance element VR may be electrically connected between the bit line BL # and the selection element SE. The variable resistance element VR may be converted into different resistance states according to a voltage difference between two ends of the variable resistance element VR or a current flowing through the variable resistance element VR. For example, the variable resistance element VR may have a high resistance state or a low resistance state.

Figure 4:
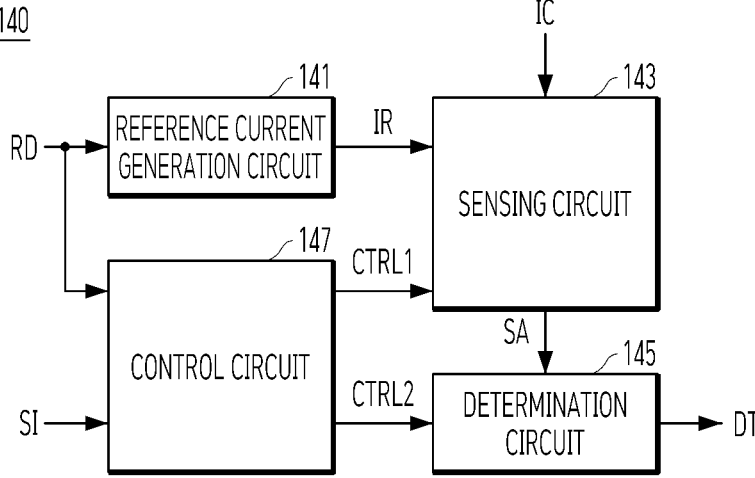
FIG. 4 is a block diagram illustrating an example of a read circuit illustrated in FIG. 1.

FIG. 4 is a block diagram illustrating an example of the read circuit 140 illustrated in FIG. 1.

Referring to FIG. 4, the read circuit 140 may include a reference current generation circuit 141, a sensing circuit 143, a determination circuit 145, and a control circuit 147.

The reference current generation circuit 141 may generate a reference current IR during the single read period on the basis of the read enable signal RD. The reference current IR may have a lower level than the cell current IC flowing through the selected memory cell when the selected memory cell is in the high resistance state. In addition, the reference current IR may have one of the possible current values of the cell current IC flowing through the selected memory cell when the selected memory cell is in the low resistance state. For example, when the selected memory cell is in the low resistance state, the cell current IC flowing through the selected memory cell may have the oscillating level in a predetermined swing range, and the reference current IR may have a certain value between the highest value and the lowest value of the predetermined swing range, such as a mean value in the predetermined swing range.

The sensing circuit 143 may be connected to the plurality of bit lines BLs through the bit line selection circuit 130. The sensing circuit 143 may compare the cell current IC flowing through the selected memory cell with the reference current IR during the single read period on the basis of a first control signal CTRL1. For example, the sensing circuit 143 may include a sensing amplifier.

The sensing circuit 143 may compare the cell current IC with the reference current IR several times at a predetermined time interval during the single read period on the basis of the first control signal CTRL1. The time interval may be set according to an oscillation period of the cell current IC when the cell current IC has the oscillating level. The sensing circuit 143 may perform a predetermined number of comparison operations on the selected memory cell regardless of the comparison result during the single read period. The sensing circuit 143 may generate a sensing signal SA according to the level of the cell current IC, e.g., the constant level or the oscillating level.

The determination circuit 145 may generate the read data DT, which corresponds to the level of the cell current IC, e.g., the constant level or the oscillating level, during the single read period on the basis of a second control signal CTRL2 and the sensing signal SA. For example, the determination circuit 145 may generate the read data DT having the first data value when the comparison result of the sensing circuit 143 indicates that the cell current IC has the constant level, and generate the read data DT having the second data value when the comparison result of the sensing circuit 143 indicates that the cell current IC has the oscillating level. In other words, the determination circuit 145 may generate the read data DT having the first data value when comparison results of predetermined number of comparison operations performed by the sensing circuit 143 are the same as each other, and generate the read data DT having the second data value when comparison results of predetermined number of comparison operations performed by the sensing circuit 143 are not the same as each other (e.g., comparison results are different from each other).

The control circuit 147 may generate the first and second control signals CTRL1 and CTRL2 on the basis of the read enable signal RD and a setting information signal SI. An activation period of the read enable signal RD may correspond to the single read period. The setting information signal SI may correspond to the predetermined number of times of the comparison operation of the sensing circuit 143.

Figure 5:
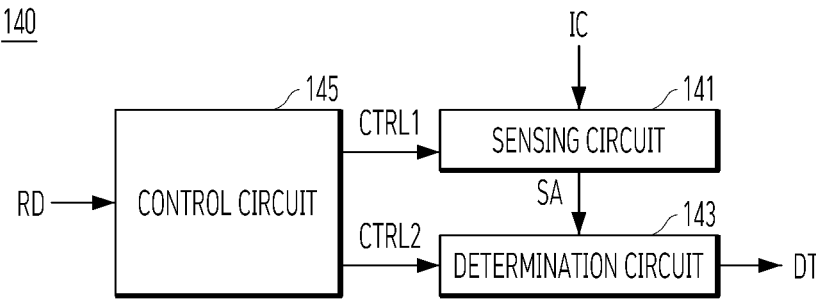
FIG. 5 is a block diagram illustrating another example of the read circuit illustrated in FIG. 1.

FIG. 5 is a block diagram illustrating another example of the read circuit 140 illustrated in FIG. 1.

Referring to FIG. 5, the read circuit 140 may include a sensing circuit 141, a determination circuit 143, and a control circuit 145.

The sensing circuit 141 may be connected to the plurality of bit lines BLs through the bit line selection circuit 130. The sensing circuit 141 may analyze a waveform of the cell current IC flowing through the selected memory cell during the single read period on the basis of a first control signal CTRL1. For example, the sensing circuit 141 may include an oscilloscope.

The sensing circuit 141 may generate a sensing signal SA, which corresponds to the analysis result of the waveform of the cell current IC, during the single read period on the basis of the first control signal CTRL1. For example, the sensing circuit 141 may analyze whether the cell current IC has the constant level or the oscillating level, and generate the sensing signal SA corresponding to the analysis result.

The determination circuit 143 may generate the read data DT, which corresponds to the level of the cell current IC, e.g., the constant level or the oscillating level, during the single read period on the basis of a second control signal CTRL2 and the sensing signal SA. For example, the determination circuit 143 may generate the read data DT having the first data value when the analysis result of the sensing circuit 141 indicates that the cell current IC has the constant level, and generate the read data DT having the second data value when the analysis result of the sensing circuit 141 indicates that the cell current IC has the oscillating level.

The control circuit 145 may generate the first and second control signals CTRL1 and CTRL2 on the basis of the read enable signal RD. An activation period of the read enable signal RD may correspond to the single read period.

Hereinafter, an operation of the memory device 100 according to the present embodiment, which has the above-described configuration, is described with reference to FIGS. 6 to 8.

FIG. 6 is a flowchart illustrating the operation of the memory device 100 illustrated in FIG. 1. For example, FIG. 6 illustrates the operation of the memory device 100 including the read circuit 140 illustrated in FIG. 4.

Referring to FIG. 6, the reference current generation circuit 141 may generate the reference current IR at S10. The reference current IR may have a lower level than a distribution of cell currents ("first distribution") flowing through the plurality of memory cells MC when all of the plurality of memory cells MC are in the low resistance state. In addition, the reference current IR may have a higher level than a distribution of cell currents ("second distribution") flowing through the plurality of memory cells MC when all of the plurality of memory cells MC are in the high resistance state. In other words, the reference current IR may be set to have a level between the first distribution and the second distribution.

One memory cell among the plurality of memory cells MC may be selected at S12. The selected memory cell may be a memory cell connected between a selected word line among the plurality of word lines WLs and a selected bit line among the plurality of bit lines BLs.

The sensing circuit 143 may compare the cell current IC flowing through the selected memory cell among the plurality of memory cells MC with the reference current IR at S14. In this case, the sensing circuit 143 may compare the cell current IC with the reference current IR several times during the single read period. For example, the sensing circuit 143 may perform the comparison operation several times during the single read period until the number of comparison operations performed by comparing the cell current IC and the reference current IR reaches a predetermined number, at S16. For reference, the sensing circuit 143 may perform the comparison operation at a predetermined time interval when comparing the cell current IC with the reference current IR several times during the single read period. It is desirable that the time interval is set according to an oscillation period of the cell current IC when the cell current IC has the oscillating level. In an example, when the sensing circuit 143 compares the cell current IC with the reference current IR two times, the time interval may be set to be between ½ and ⅔ of the oscillation period. In another example, when the sensing circuit 143 compares the cell current IC with the reference current IR three or more times, the time interval may be set to be between ¼ and ½ of the oscillation period.

The determination circuit 145 may generate the read data DT corresponding to the comparison result of the sensing circuit 143, at S18. When the cell current IC has the constant level, the determination circuit 145 may generate the read data DT having the first data value. When the cell current IC has the oscillating level, the determination circuit 145 may generate the read data DT having the second data value. The first data value may be a data value corresponding to the high resistance state, and the second data value may be a data value corresponding to the low resistance state.

Figure 7:
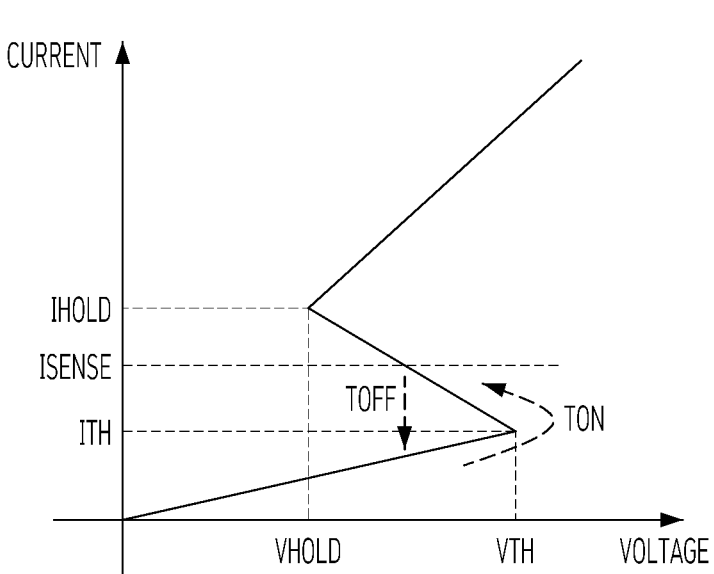
FIGS. 7 and 8 illustrate examples of the operation of the memory device illustrated in FIG. 6.
Figure 8:
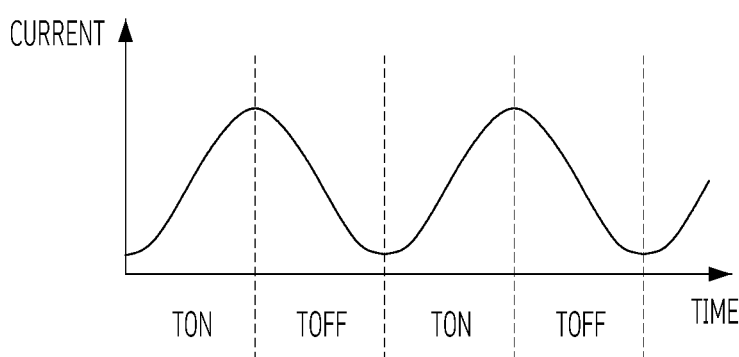

FIGS. 7 and 8 are graphs for describing why the cell current IC has the oscillating level in FIG. 6. FIG. 7 shows a current-voltage characteristic curve of the memory cell MC # included in the memory device 100, and FIG. 8 shows the cell current IC having the oscillating level.

Referring to FIGS. 7 and 8, a turn-on condition of the selection element SE included in the memory cell MC # may be represented as shown in Equation (Inequation) 1 below.

$$VC > VTH, \text{ and } IC > ITH \qquad \text{[Equation 1]}$$

Here, "VC" may denote a voltage of one end of the selection element SE, e.g., a voltage applied to the word line WL # or the bit line BL #, "VTH" may denote a threshold voltage for turning on the selection element SE, and "ITH" may denote a threshold current for turning on the selection element SE.

A turn-off condition of the selection element SE may be represented as shown in Equation (Inequation) 2 below.

$$VC < VHOLD, \text{ or } IC < IHOLD \qquad \text{[Equation 2]}$$

Here, "VHOLD" may denote a minimum voltage for maintaining a turn-on state of the selection element SE, and "IHOLD" may denote a minimum current for maintaining the turn-on state of the selection element SE.

When the single read period starts, the voltage VC of one end of the selection element SE may become higher than the threshold voltage VTH while being boosted. In this case, the cell current IC may be smaller than the minimum current IHOLD and greater than the threshold current ITH. Accordingly, as the selection element SE satisfies the turn-on condition (e.g., "TON"), the selection element SE may be turned on, and the cell current IC having a gradually increasing level may flow through the selection element SE. However, since the cell current IC is smaller than the minimum current IHOLD, the selection element SE does not satisfy the condition for maintaining the turn-on state (e.g., "TOFF"), and thus the selection element SE may be turned off, and the cell current IC having a gradually decreasing level may flow through the selection element SE. Meanwhile, since the voltage VC of one end of the selection element SE is continuously boosted, the selection element SE satisfies the turn-on condition again (e.g., "TON"), and thus the selection element SE may be turned on, and the cell current IC having a gradually increasing level may flow through the selection element SE. However, since the cell current IC is still smaller than the minimum current IHOLD, the selection element SE does not satisfy the condition for maintaining the turn-on state (e.g., "TOFF"), and thus the selection element SE may be turned off, and the cell current IC having a gradually decreasing level may flow through the selection element SE.

In this manner, the selection element SE may repeatedly be in a state of satisfying the turn-on condition of the selection element SE (e.g., "TON") and a state of not satisfying the condition for maintaining the turn-on state of the selection element SE (e.g., "TOFF"). Thus, the cell current IC flowing through the memory cell MC # may have the oscillating level.

The disclosed technology can be implemented in some embodiments to detect a resistance state based on or according to a change in a cell current during a read operation, thereby minimizing a read error even if a sensing margin between two distributions (e.g., the first and second distributions) is not sufficiently secured.

In addition, the disclosed technology can be implemented in some embodiments to provide a memory device that can prevent a read error when reading data from a selected memory cell, thereby improving reliability of a read operation.

While the disclosed technology has been illustrated and described with respect to specific embodiment, it should be understood that various enhancements and modifications of the disclosed embodiments and other embodiments may be made based on what is described and illustrated in this patent document.

What is claimed is:

1. A memory device comprising:
   a memory cell array including a plurality of memory cells, each of the plurality of memory cells configured to store a first data value or a second data value corresponding to read data to be read out through a plurality of conductive lines; and
   a read circuit coupled to the plurality of conductive lines to generate the read data corresponding to the first data value or the second data value stored in a selected memory cell among the plurality of memory cells based on whether there is a change in a cell current flowing through the selected memory cell during a single read period,
   wherein, during the single read period, the read circuit generates the read data having the first data value responsive to the cell current having a constant level, and generates the read data having the second data value responsive to the cell current having an oscillating magnitude.

2. The memory device of claim 1, wherein the read data corresponds to a resistance state of the selected memory cell, wherein the resistance state of the selected memory cell includes a high resistance state and a low resistance state lower than the high resistance state, wherein the first data value corresponds to the high resistance state, and the second data value corresponds to the low resistance state.

3. The memory device of claim 1, wherein the read circuit performs N sensing operations to detect the cell current flowing through the selected memory cell during the single read period, wherein N is an integer larger than 1.

4. The memory device of claim 3, wherein the N sensing operations are performed on the selected memory cell regardless of a sensing result of at least one of the N sensing operations during the single read period.

5. The memory device of claim 3, wherein the read data has the first data value responsive to the N sensing operations yielding identical sensing results, or the read data has the second data value responsive to the N sensing operations yielding at least one sensing result that differs from the other sensing results.

6. The memory device of claim 5, wherein the read data corresponds to a resistance state of the selected memory cell, wherein the resistance state of the selected memory cell includes a high resistance state and a low resistance state lower than the high resistance state, wherein the first data value corresponds to the high resistance state, and the second data value corresponds to the low resistance state.

7. The memory device of claim 1, wherein the read circuit includes:

a sensing circuit to detect a change in the cell current flowing through the selected memory cell during the single read period; and a determination circuit to determine the data value stored in the selected memory cell, according to a sensing result of the sensing circuit.

8. A memory device comprising:

a memory cell array including a plurality of memory cells, each of the plurality of memory cells configured to store a data value corresponding to read data to be read out through a plurality of conductive lines;

a sensing circuit coupled to the plurality of conductive lines to compare a cell current flowing through a selected memory cell among the plurality of memory cells with a reference current during a single read period; and a determination circuit coupled to the sensing circuit to: generate the read data having a first data value responsive to a comparison result of the sensing circuit indicating that the cell current has a constant level during the single read period; or generate the read data having a second data value responsive to a comparison result of the sensing circuit indicating that the cell current has an oscillating magnitude during the single read period.

9. The memory device of claim 8, wherein the sensing circuit performs M comparison operations to compare the cell current with the reference current at a predetermined time interval during the single read period, wherein M is an integer larger than 1.

10. The memory device of claim 9, wherein the time interval is set according to an oscillation period of the cell current having the oscillating magnitude.

11. The memory device of claim 9, wherein the sensing circuit performs M comparison operations on the selected memory cell regardless of a comparison result of at least one of the M comparison operations during the single read period.

12. The memory device of claim 9, wherein the read data has the first data value responsive to comparison results that are same for the M comparison operations, or the read data has the second data value responsive to comparison results that are different for the M comparison operations.

13. The memory device of claim 8, wherein the read data corresponds to a resistance state of the selected memory cell, wherein the resistance state of the selected memory cell includes a high resistance state and a low resistance state lower than the high resistance state, wherein the first data value corresponds to the high resistance state, and the second data value corresponds to the low resistance state.

14. An operating method of a memory device, comprising:

setting a reference current to: a lower level than a distribution of cell currents flowing through memory cells that are in a low resistance state; or a higher level than the distribution of the cell currents flowing through memory cells that are in a high resistance state higher than the low resistance state;

performing M comparison operations to compare a cell current flowing through a selected memory cell among the memory cells with the reference current, wherein M is an integer larger than 1; and generating read data having a second data value responsive to a comparison result indicating that the cell current has an oscillating magnitude.

15. The operating method of claim 14, wherein the read data has a first data value responsive to a comparison result indicating that the cell current has a constant level.

16. The operating method of claim 15, wherein the read data corresponds to a resistance state of the selected memory cell, wherein the resistance state of the selected memory cell includes a high resistance state and a low resistance state lower than the high resistance state, wherein the first data value corresponds to the high resistance state, and the second data value corresponds to the low resistance state.

17. The operating method of claim 14, wherein the M comparison operations are performed at a predetermined time interval during a single read period.

18. The operating method of claim 17, wherein the time interval is set according to an oscillation period of the cell current having the oscillating magnitude.

* * * * *